(12) United States Patent
Milsom et al.

(10) Patent No.: US 8,008,993 B2
(45) Date of Patent: Aug. 30, 2011

(54) THIN-FILM BULK-ACOUSTIC WAVE (BAW) RESONATORS

(75) Inventors: Robert Frederick Milsom, Redhill (GB); Frederik Willem Maurits Vanhelmont, Genk (BE); Andreas Bernardus Maria Jansman, Nuenen (NL); Jaap Ruigrok, Asten (NL); Hans-Peter Loebl, Monschau-Imgenbroich (DE)

(73) Assignee: NXP B.V., Eindhoven (NL)

( * ) Notice: Subject to any disclaimer, the term of this patent is extended or adjusted under 35 U.S.C. 154(b) by 225 days.

(21) Appl. No.: 12/088,721

(22) PCT Filed: Sep. 28, 2006

(86) PCT No.: PCT/IB2006/053534
§ 371 (c)(1),
(2), (4) Date: Aug. 15, 2008

(87) PCT Pub. No.: WO2007/036897
PCT Pub. Date: Apr. 5, 2007

(65) Prior Publication Data
US 2009/0153268 A1    Jun. 18, 2009

(30) Foreign Application Priority Data
Sep. 30, 2005    (EP) .................................... 05109109

(51) Int. Cl.
*H03H 9/15* (2006.01)
*H03H 9/54* (2006.01)
*H03H 3/02* (2006.01)

(52) U.S. Cl. ......... 333/187; 333/189; 310/312; 310/326

(58) Field of Classification Search .......... 333/187–189, 333/133; 310/312, 326, 322, 324, 335
See application file for complete search history.

(56) References Cited

U.S. PATENT DOCUMENTS
3,585,418 A * 6/1971 Koneval ........................ 310/326
(Continued)

FOREIGN PATENT DOCUMENTS
WO    2005034345 A1    4/2005

OTHER PUBLICATIONS

Kaitila, J; et al "Spurious Resonance Free Bulk Acoustic Wave Resonators" IEEE Ultrasonics Symposium 2003, Honolulu, HI, vol. 1, Oct. 2003, pp. 84-87.

Milsom, R. F; et al "Combined Acoustic-Electromagnetic Simulation of Thin-Film Bulk Acoustic Wave Filters" IEEE Ultrasonics Symposium 2002, vol. 1, October 2002, pp. 989-994.

(Continued)

*Primary Examiner* — Barbara Summons

(57) ABSTRACT

A thin-film bulk acoustic wave (BAW) resonator, such as SBAR or FBAR, for use in RF selectivity filters operating at frequencies of the order of 1 GHz. The BAW resonator comprises a piezoelectric layer (14) having first and second surfaces on opposing sides, a first electrode (16) extending over the first surface, and a second electrode (12) extending over the second surface, the extent of the area of overlap (R1) of the first and second electrodes determining the region of excitation of the fundamental thickness extensional (TE) mode of the resonator. The insertion loss to the resonator is reduced by providing a dielectric material (18) in the same layer as the first electrode (16) and surrounding that electrode. The material constituting the dielectric material (18) has a different mass, typically between 5% and 15%, from the material comprising the first electrode (16) it surrounds. The mass of the dielectric material (18) can be lower or higher than the mass of the first electrode (16). Planarisation of the dielectric material (18) enhances the performance of the device.

14 Claims, 7 Drawing Sheets

U.S. PATENT DOCUMENTS

| | | | |
|---|---|---|---|
| 6,788,170 B1* | 9/2004 | Kaitila et al. | 333/187 |
| 2002/0014808 A1* | 2/2002 | Misu et al. | 310/312 |
| 2002/0030424 A1 | 3/2002 | Iwata | |
| 2004/0056735 A1* | 3/2004 | Nomura et al. | 333/133 |

OTHER PUBLICATIONS

Loebl, H-P; et al "Solidly Mounted Bulk Acoustic Wave (BAW) Filters for the Ghz Frequency Range" IEEE Ultrasonics Symposium 2002, vol. 1, Oct. 2002, pp. 919-923.

* cited by examiner

THIN-FILM BULK-ACOUSTIC WAVE (BAW) RESONATORS

TECHNICAL FIELD

The present invention relates to a bulk-acoustic wave (BAW) resonator which has particular, but not exclusive, application to filters for the radio-frequency (RF) selectivity function in applications above about 1 GHz, for example in mobile communication and wireless connectivity devices. The present invention also relates to a method of reducing insertion loss in the passband of a bulk acoustic wave (BAW) resonator.

BACKGROUND ART

The basic building blocks of thin-film bulk-acoustic wave filters are BAW resonators using either Film-Bulk-Acoustic-wave-Resonator (FBAR) or Solidly-mounted-Bulk-Acoustic-wave-Resonator (SBAR or SMR) technology. Low insertion-loss in the pass-band of such a filter is an essential requirement. Typically 2 to 3 dB insertion loss is achieved, while less than 1 dB is preferred in many specifications.

In recent years investigations have been made with a view to improving the performance of BAW devices.

J. Kaitila, et al, "Spurious Resonance Free Bulk Acoustic Wave Resonators", IEEE Ultrasonics Symposium, Honolulu, p. 84, 2003 discloses a method for reducing unwanted standing waves by employing a frame-region round each resonator. It is said that it reduces energy loss to some extent but there has been no adequate explanation of why such a construction should reduce loss.

US 2002/0030424 A1 discloses suppressing the occurrence of spurious modes due to an inharmonic mode generated in a high frequency piezoelectric resonator by a device structure comprising an AT cut quartz crystal plate having top and bottom surfaces. A top excitation electrode, termed the main electrode, is provided on a predetermined area of the top surface and a bottom excitation electrode is provided over the entire area of the bottom surface. A second electrode is provided on the top surface surrounding the main electrode but leaving a gap between the juxtaposed edges of the main and second electrodes. The second electrode is provided for suppressing spurious modes. In some of the embodiments described the materials of the main and second electrodes are different with the density of the material, for example silver, comprising the second electrode being lower than the density of the material, for example gold, comprising the main electrode. Additionally the thickness of the second electrode is greater than that of the main electrode in order to restrict the object waves of the energy-trapped mode to only the main vibration alone. In the case of using gold and silver for the main and second electrodes, respectively, the thickness of the second electrode is approximately twice that of the main electrode. Further it is necessary to set the cut-off frequencies of the main and second electrodes so that the cut-off frequency (f3) of the second electrode is higher than the cut-off frequency (f1) of the main electrode and the cut-off frequency (f2) of the gap is higher than f3, viz, f1<f3<f2.

Earlier research, R. F. Milsom, et al "Combined acoustic-EM simulation of thin-film bulk acoustic wave filters", IEEE Ultrasonics Symposium, Munich, p. 963, 2002, established that the dominant loss mechanism in thin-film BAW resonators is acoustic in origin, except over a very narrow range of frequencies near the resonance frequency $f_r$ (frequency of maximum admittance) where electrical resistance is the dominant source of loss. It is also clear, from the observation that the unexplained losses varied strongly with frequency, that viscosity and other material-related mechanisms within the thin-film layers could not be the primary cause. For example, the acoustic loss at anti-resonance $f_a$ is much greater than at resonance, where these two frequencies differ only by about 3%. From this strong frequency-dependence it was concluded that the likely cause was the unwanted radiation of travelling acoustic wave energy away from each resonator, accompanying the wanted thickness extensional (TE) mode standing-wave energy. The travelling acoustic waves are Lamb waves in the case of a FBAR and surface acoustic waves and leaky waves in the case of a SBAR. However, prior to the development of the new 2D model, the precise mechanism was not identified or quantified, and therefore no effective remedy could be introduced.

DISCLOSURE OF INVENTION

It is an object of the present invention to reduce loss in BAW resonators and insertion loss in BAW filters.

According to a first aspect of the present invention there is provided a bulk acoustic wave (BAW) resonator comprising first and second layers and an intervening piezoelectric layer, the first and second layers comprising respective first and second overlapping regions of metal for use as electrodes, the first layer further comprising a region of dielectric material external to the region of the overlap and at least partially surrounding the first metal region, wherein the dielectric material has a mass different from the mass of the first metal region.

According to a second aspect of the present invention there is provided a filter comprising a plurality of BAW resonators in accordance with a first aspect of the present invention.

According to a third aspect of the present invention there is provided a radio frequency apparatus including a filter comprising a plurality of BAW resonators in accordance with the first aspect of the present invention.

According to a fourth aspect of the present invention there is provided a method of reducing insertion loss in the passband of a filter comprising a plurality of bulk acoustic wave (BAW) resonators, each of the BAW resonators comprising first and second layers and an intervening piezoelectric layer, the first and second layers comprising respective first and second overlapping regions of metal for use as electrodes, the method comprising forming in the first layer a region of dielectric material external to the region of the overlap and at least partially surrounding the first metal region, wherein the dielectric material has a mass different from the mass of the first metal region.

The region of overlap of the first and second regions of metal determines the region of excitation of the fundamental TE mode.

The present invention is based on the realisation obtained from two dimensional (2D) modelling of a BAW resonator that the primary source of energy loss in such (otherwise low-loss) devices is the strong radiation of an acoustic wave away from the BAW resonators over a narrow band of frequencies referred to in the present specification as the "radiation-band". The radiation band in a FBAR is well defined but in a SBAR the band edges are less well defined but broadly the same effect occurs. The model shows that the radiation band is a property of the relationship between the materials used in the structure of the thin film layer stacks inside and outside the area occupied by each resonator. In the BAW filters made in accordance with the present invention these layers are chosen such that the radiation-band is shifted either above or below the filter passband thus eliminating this dominant source of insertion loss. Ideally, the total relative offset should be just enough to prevent overlap of the radiation-band and passband, with no more than a small margin between the bands otherwise unwanted surface acoustic waves in a SBAR and Lamb waves in a FBAR are increased and losses due to these waves dominate.

In an embodiment of the present invention the difference in mass of the dielectric material and the first metal region is between 5% and 15%.

In one example the mass of the dielectric material is greater than the mass of the first metal region. For example the dielectric material may comprise a relatively heavy or high mass dielectric material such as tantalum pentoxide ($Ta_2O_5$) and the first metal region may comprise a relatively low mass conductor such as aluminium (Al). This structure moves the radiation-band down in frequency relative to the filter passband.

In another example the mass of the dielectric material is less than the mass of the first metal region. For example the first metal region may comprise a relatively heavy or high mass conductor such as platinum (Pt) and the dielectric material may comprise a relatively light or low mass dielectric material such as tantalum pentoxide ($Ta_2O_5$). In further example in which the mass of the dielectric material is less than the mass of the first metal region, the first metal region may comprise a relatively heavy or high mass conductor such as molybdenum (Mo) and the dielectric material may comprise a relatively light or low mass dielectric material such as silicon dioxide ($SiO_2$). These structures move the radiation-band up in frequency relative to the filter passband.

If desired the dielectric material may form a planarisation material, having the same thickness as the first metal region which it at least partially surrounds.

BRIEF DESCRIPTION OF DRAWINGS

The present invention will now be described, by way of example, with reference to the accompanying drawings, wherein.

In the drawings the same reference numerals have been used to indicate corresponding features.

MODES FOR CARRYING OUT THE INVENTION

Figure 1:
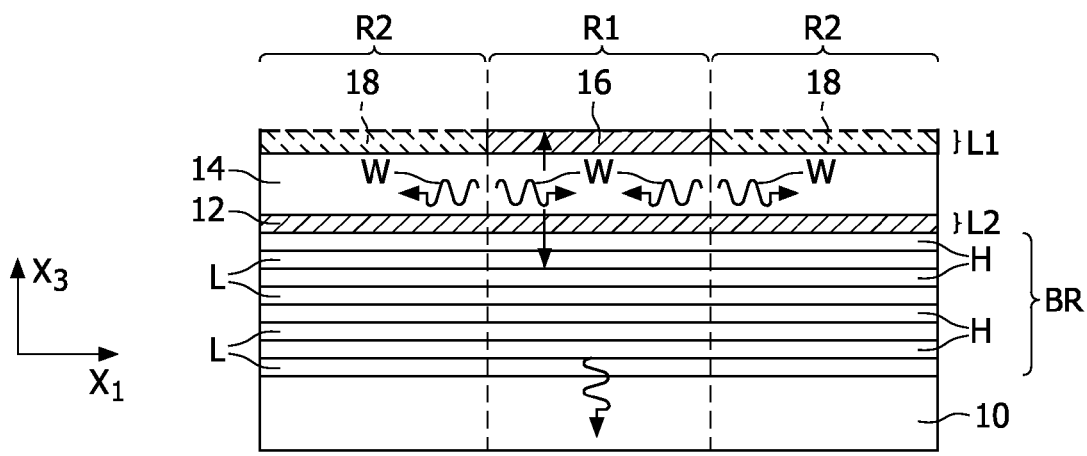
FIG. 1 is a cross-section through the layers of a SBAR.
Figure 2:
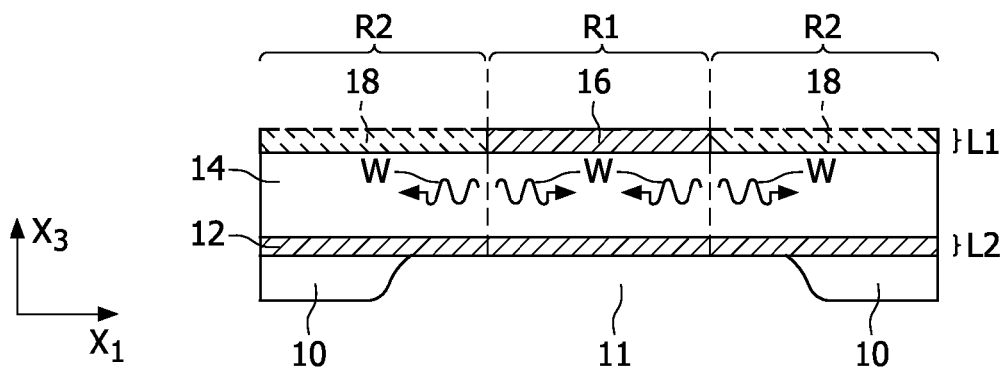
FIG. 2 is a cross-section through the layers of a FBAR.

The description of FIGS. 1 and 2 will initially describe the prior art BAW devices and the effect of the existence of the radiation-band. Afterwards the measures for overcoming the effect of the radiation-band will be described.

The SBAR shown in FIG. 1 comprises a substrate 10 typically of silicon (Si) which constitutes the entire area of the SBAR. An acoustic Bragg reflector BR, comprising alternate low (L)—and high (H)—mechanical-impedance layers, typically silicon dioxide ($SiO_2$) and tantalum pentoxide ($Ta_2O_5$), respectively, is provided on the substrate 10. A piezoelectric structure is provided on the Bragg reflector BR. The piezoelectric structure comprises a bottom electrode 12 in a bottom layer L2 and typically covers an area of the bottom surface of a piezoelectric layer 14 which is greater than the area of a top electrode 16 in a top layer L1. The bottom electrode 12 comprises typically titanium and platinum (Ti/Pt) and the piezoelectric layer 14 typically comprises aluminium nitride (AlN). The top electrode 16, typically comprising aluminium (Al), is provided on a limited central portion of an upper surface of the piezoelectric layer 14. The top electrode 16 may be of any suitable shape such as circular, elliptical or rectangular, for example square optionally having rounded corners.

As viewed in cross-section the SBAR comprises an internal region R1 (or region type 1) and an external region R2 (or region type 2). The internal region R1 is effectively defined by the top electrode 16 and all the portions of the piezoelectric layer 14, lower electrode 12, the Bragg reflector BR and the substrate 10 immediately beneath the top electrode layer 16. The external region R2 (or region type 2) comprises those areas of the layers L1, L2, the Bragg reflector BR and the substrate 10 lying outside the area defined by the top electrode 16. The structure of the SBAR described so far is of a typical device.

The external region R2 in FIG. 1 comprises an additional dielectric layer 18 which surrounds the top electrode layer 16 and which will be discussed later when describing the present invention.

FIG. 2 shows the cross-section through the layers of a typical FBAR. Compared to the structure of the SBAR shown in FIG. 1, the Bragg reflector is replaced by an air-gap 11. Typical FBARs are made by depositing the bottom and top electrodes 12, 16 and the piezoelectric layer 14 on a silicon substrate 10, and then micro-machining the silicon substrate 10 to form the air-gap 11 below the portion of the bottom electrode 12 overlapped by the top electrode 16. Also shown in FIG. 2 in the layer L1 is an additional dielectric material 18, typically tantalum pentoxide, in the external region R2 above the piezoelectric layer 14. This additional dielectric material 18 has as shown in FIG. 2, a thickness equal to that of the top electrode 16 in the internal region R1 but in other embodiments the dielectric material 18 may be of a different thickness from that of the top electrode 16. When the dielectric material 18 has a thickness equal to that of the top electrode 16 it is termed a planarisation material. The dielectric material 18 constituting the external region R2 areas of the SBAR shown in FIG. 1 can be a planarisation material. The FBAR shown in FIG. 2 typically has a width of 200 μm and the thickness of the top electrode 16 comprising aluminium and of the planarised tantalum pentoxide dielectric material in the top layer L1 is 100 nm.

In operation when an alternating signal is applied between top and bottom electrodes 12, 16, an acoustic vibration is excited in the piezoelectric layer. A commonly-used simple 1D model of either type of thin-film BAW resonator assumes that the acoustic vibration is purely longitudinal with motion only in the $x_3$-direction shown in FIGS. 1 and 2, i.e. normal to the layers. This vibration is referred to as the thickness extensional (TE) mode. This 1D model further assumes that there is no vibration in the external regions R2. The model describes the desired resonator behaviour, rather than its actual behaviour, but in some cases gives quite accurate predictions of device performance. However, the acoustic vibration predicted is in effect only the "driving" field. It ignores waves W (FIGS. 1 and 2) excited by this "driving" field which propagate in other directions, in particular modes guided in the $x_1$-direction parallel to the layers. (For the layer orientations involved no loss of generality results from ignoring $x_2$-dependence). These unwanted modes have complicated vibration patterns with coupled shear (mainly $x_1$-directed) and longitudinal (mainly $x_3$-directed) motion. Energy-conversion between these modes and scattering at electrode edges gives rise to unwanted losses. In the case of the SBAR some modes can also leak energy away from the resonator through the reflector. Scattering and loss due to mode-conversion is reduced by the planarisation layer.

Figure 3:
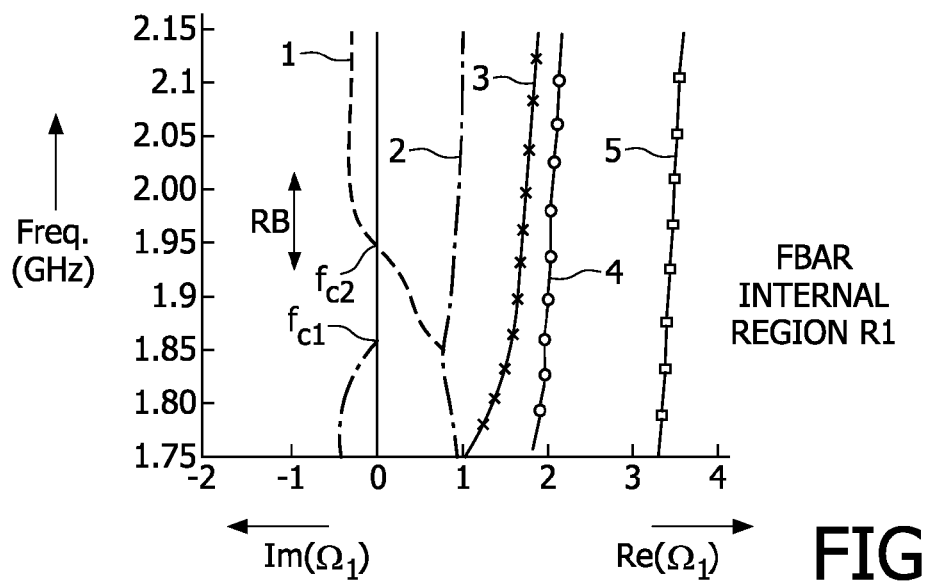
FIG. 3 illustrates dispersion curves for the five most important laterally guided modes of the internal region R1 of a FBAR.
Figure 4:
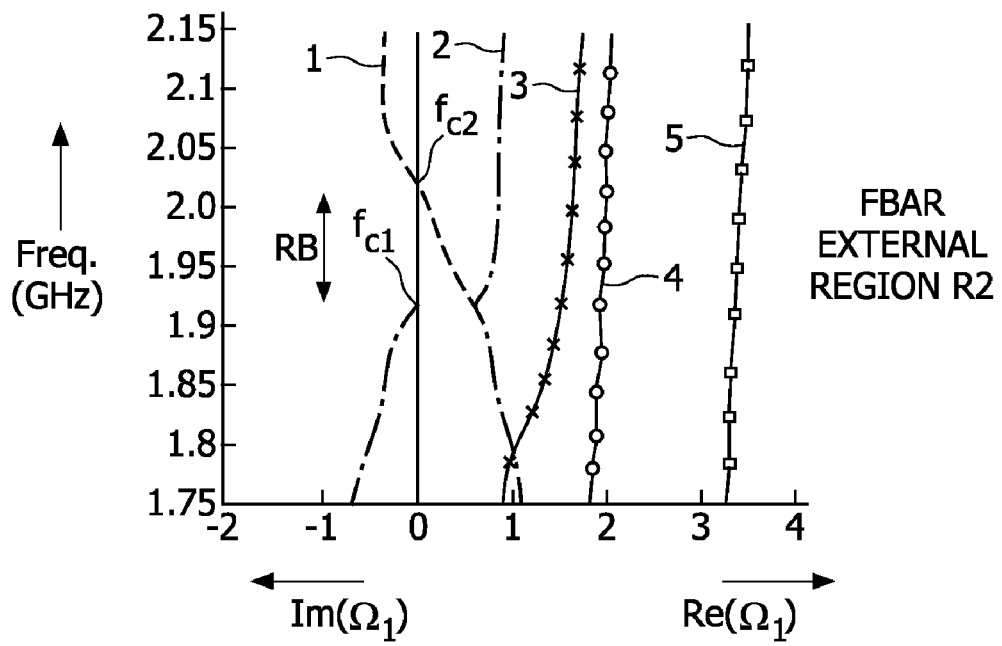
FIG. 4 illustrates dispersion curves for the five most important laterally guided modes of the external region R2 of a FBAR planarised with $SiO_2$.
Figure 5:
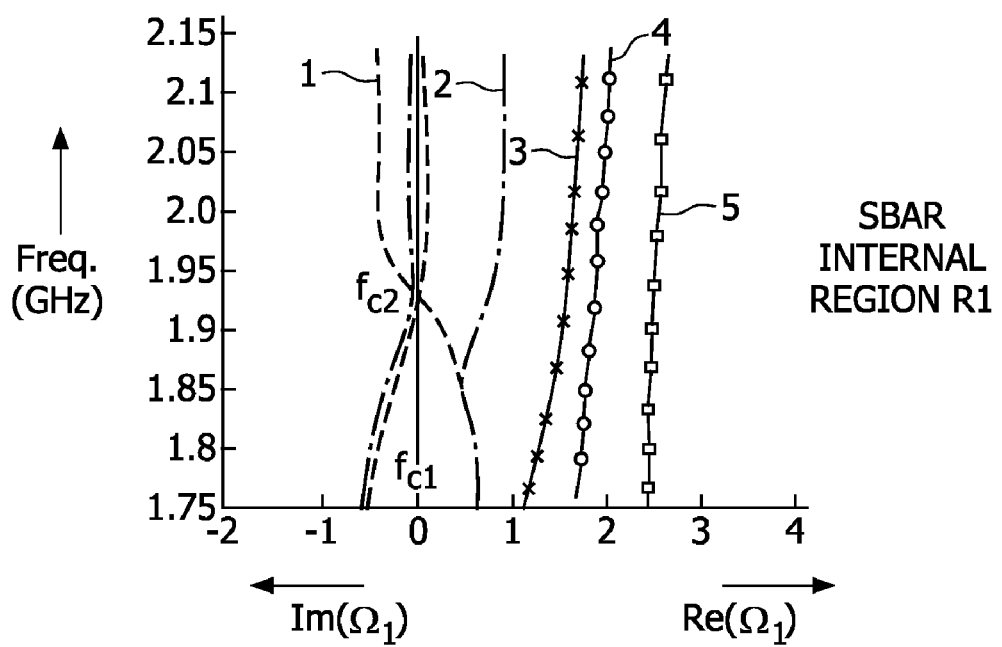
FIG. 5 illustrates dispersion curves for the five most important laterally guided modes of the internal region R1 of a SBAR.
Figure 6:
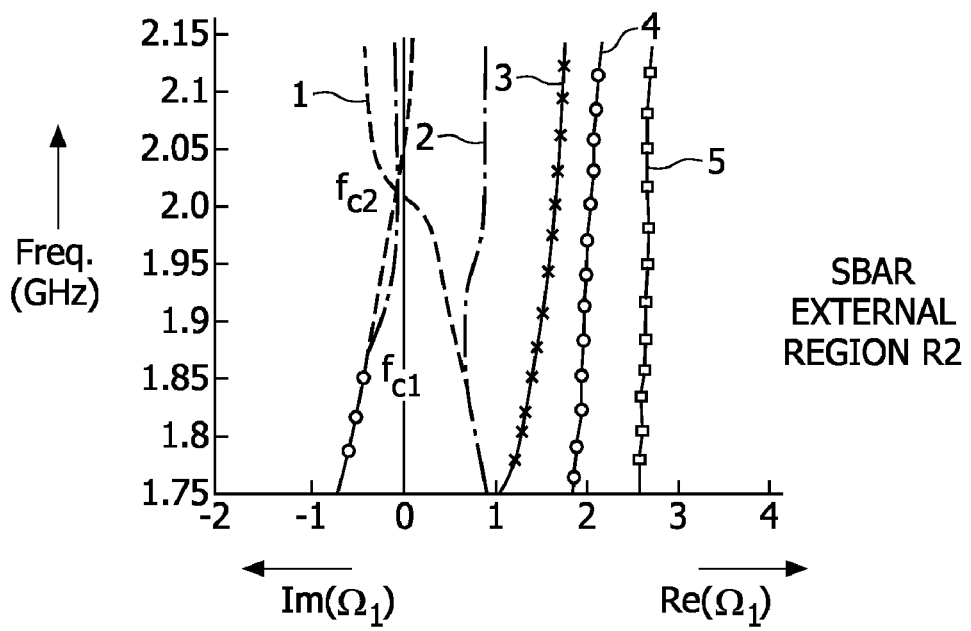
FIG. 6 illustrates dispersion curves for the five most important laterally guided modes of the external region R2 of a SBAR planarised with $SiO_2$.
Figure 7:
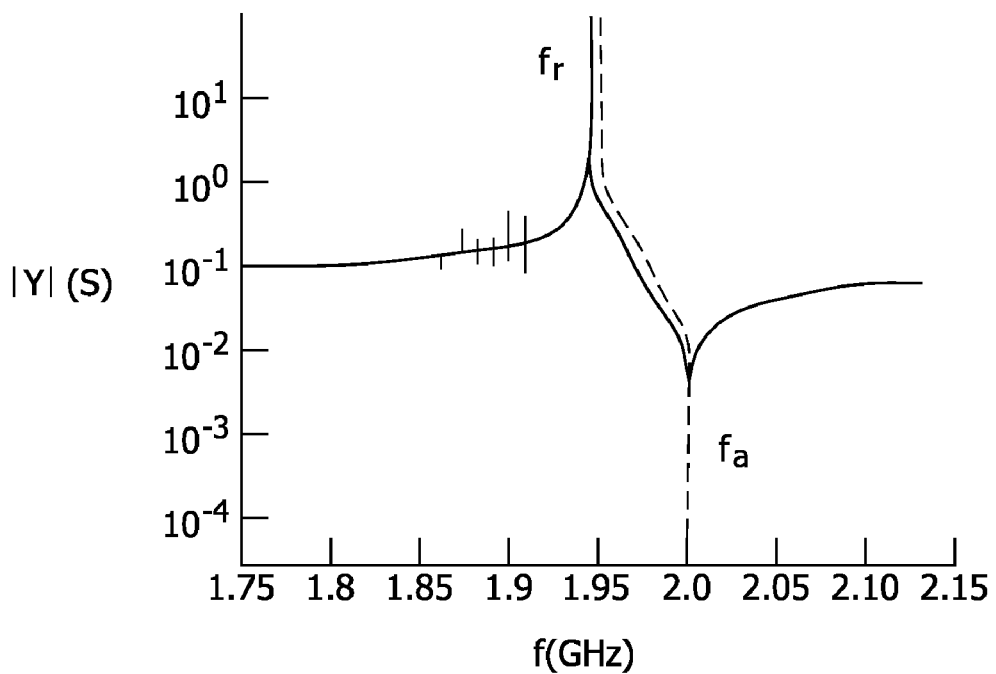
FIG. 7 illustrates the magnitude of the admittance Y of a FBAR, the broken line relates to a 1D model and the continuous line relates to a 2D model.

For any given guided mode the relationship between its $x_1$-component of (normalised) wave-number $\Omega$ and frequency is described by a dispersion curve. FIGS. 3 and 4 show, respectively, dispersion curves for both the internal region R1 and external region R2 of an FBAR, while FIGS. 5 and 6 show equivalent curves for a corresponding SBAR. In both cases the top layer L1 has been planarised with a silicon dioxide ($SiO_2$) dielectric layer. The convention in these diagrams is to display frequency on the y-axis, real part of wave-number on the positive x-axis $Re(\Omega_1)$ and imaginary part of wave-number on the negative x-axis $Im(\Omega_1)$. In these examples the five most significant guided modes are shown. In the FBAR these are generalised Lamb waves, and in the SBAR modes 1 and 2, are leaky waves (i.e. they leak energy through the reflector into the substrate at some frequencies), while modes 3, 4 and 5 are surface acoustic waves. In both types of resonator mode 1 is the most strongly-excited, because over the frequency range of interest its vibration pattern corresponds closely to that of the "driving" field. This waveguide mode typically has two important characteristic cut-off frequencies $f_{c1}$ and $f_{c2}$. Consider the FBAR first (FIGS. 3 and 4). Below $f_{c1}$ the wave-number of mode 1 is complex, and in fact modes 1 and 2 are complex conjugates (the mode 1 curve being hidden below the mode 2 curve). Above the frequency $f_{c2}$ the mode 1 wave-number is imaginary. Between the frequencies $f_{c1}$ and $f_{c2}$ the mode 1 wave-number is real, which means this mode can propagate unattenuated in the x1-direction. The effect is that between the frequencies $f_{c1}$ and $f_{c2}$ the acoustic energy associated with mode 1 propagates away from the resonator into the external region R2, giving rise to substantial energy-loss over this frequency range, which is defined here as the "radiation-band", RB in FIGS. 3 and 4. It is now clear that this is the dominant component of energy loss in some designs of thin-film BAW resonators and filters.

Figure 8:
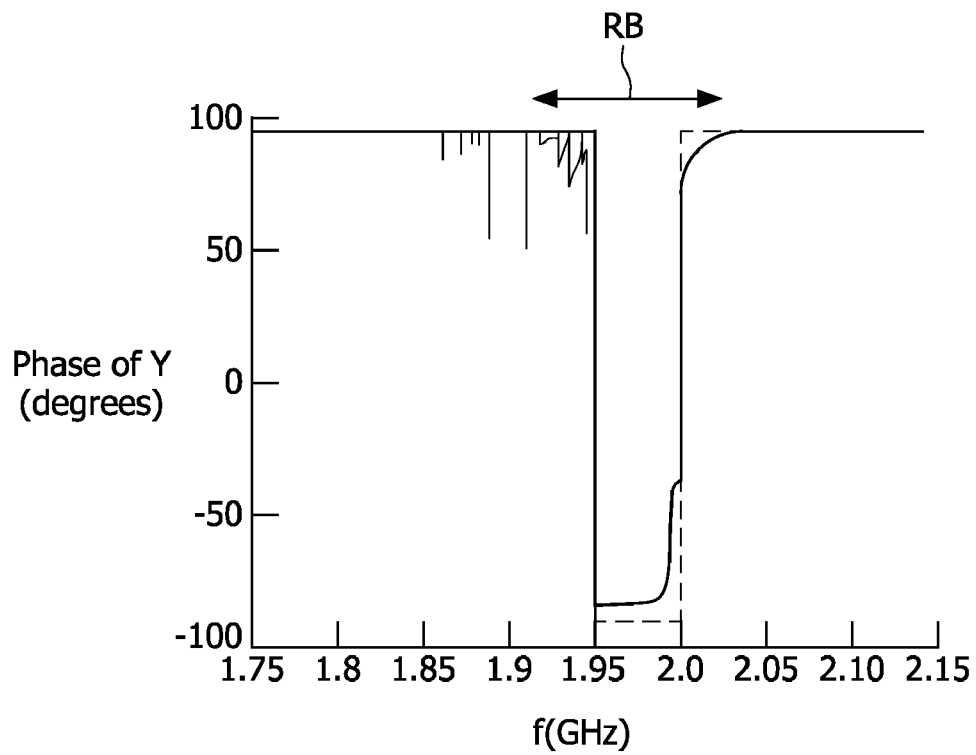
FIG. 8 illustrates the phase of the admittance Y of a FBAR, the broken line relates to a 1D model and the continuous line relates to a 2D model.
Figure 9:
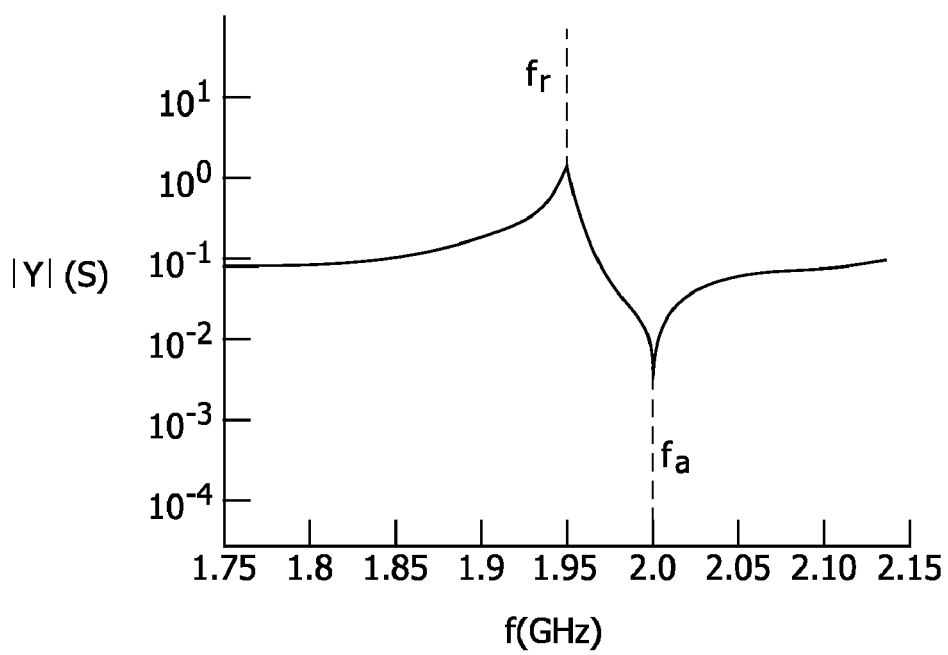
FIG. 9 illustrates the magnitude of the admittance Y of a SBAR, the broken line relates to a 1D model and the continuous line relates to a 2D model.
Figure 10:
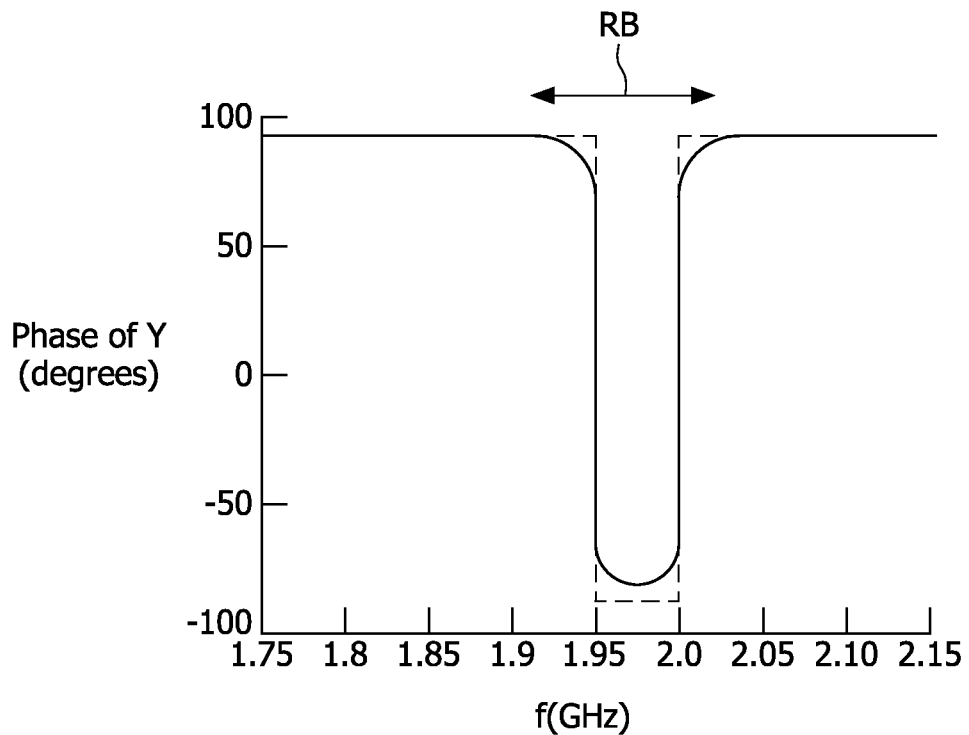
FIG. 10 illustrates the phase of the admittance Y of a SBAR, the broken line relates to a 1D model and the continuous line relates to a 2D model.

FIGS. 7 to 10 show the magnitude and phase of the admittance versus frequency of typical FBAR (FIGS. 7 and 8) and SBAR (FIGS. 9 and 10). The broken lines relate to the 1D model and the continuous line relates to a 2D model. The layer combinations in the FBAR and SBAR are such that their resonance and anti-resonance frequencies occur in the "radiation band". Thus the filter pass band and the "radiation band" overlap. In the simple 1D model of FBAR (FIG. 7), which effectively assumes an ideal resonator, the phase is +90 degrees below resonance $f_r$, –90 degrees between resonance $f_r$ and anti-resonance $f_a$, and +90 degrees again above anti-resonance $f_a$. The effect of loss due to radiation of mode 1 in the radiation-band is most noticeable in the rounding of this phase-response (FIG. 8). The effect is similar in the SBAR (FIG. 10) despite some differences in the mode 1 dispersion curves. In particular the SBAR mode 1 wave-number is complex at all frequencies, and above $f_{c1}$ its imaginary part is associated with loss through the reflector. This relatively small component of loss is actually useful, being sufficient to effectively suppress all the unwanted resonances that would occur below $f_r$ in the equivalent FBAR response, while overall loss is not substantially increased relative the FBAR. This can be seen from the comparable degree of rounding at anti-resonance in the two devices. The automatic suppression of these unwanted resonances, in SBARs having the layer configuration investigated here, removes any need for the frame-region. A component of loss (and also some ripple) in both FBAR and SBAR is the result of mode-conversion to laterally guided modes other than mode 1. This can be minimised by planarisation, i.e. adding the dielectric material 18 in the external regions R2 such that the total thickness of the layer L1 and the whole structure is the same everywhere, as shown for example in FIG. 2. However, planarisation as such does not reduce the radiation of mode 1, and it is the reduction of this more significant loss which is achieved by the measure taken in accordance with the present invention.

The present invention exploits the fact that the frequency interval defining a thin-film BAW filter pass-band is essentially a property of the layer stack of the internal (electroded) region R1 of each resonator, while the frequency interval defining the "radiation-band" is essentially a property of the layer stack of the external (non-overlap) regions R2 surrounding the resonators. In principal therefore, these are independent and it is proposed here that the materials of the layer stacks defining the two regions are selected such that these two frequency bands do not overlap, thus eliminating the radiation of mode 1 in the filter pass-band. This can be achieved using various different methods. In a first example of the method, a light (low-mass) conductor such as aluminium (Al) is used for the top electrode 16, and a heavy (high mass) dielectric such as tantalum-pentoxide ($Ta_2O_5$) is used for the surrounding dielectric material 18. This moves the "radiation-band" down in frequency relative to filter pass-band. In a second example of the method, a relatively heavy conductor, such as platinum (Pt), is used for the top electrode 16, and a relatively light dielectric material, such as tantalum-pentoxide ($Ta_2O_5$), is used for the surrounding dielectric material 18. In a third example of the method, the relatively heavy top electrode 16 comprises molybdenum (Mo) and the relatively light dielectric material 18 comprises silicon dioxide ($SiO_2$). Using the combinations of materials given in the second and third examples moves the radiation band up in frequency relative to the pass-band. The relative masses of the materials forming the top electrode 16 and the dielectric material 18 determine the frequency shift between the internal and external regions R1 and R2, respectively. The amount of this shift is a function of both density and thickness of these uppermost layers. In addition to mass-loading considerations, an important additional factor which has to be taken into account, is that there is a reduction in filter pass-band frequency due to the electrical shorting of the surfaces of the piezoelectric layer 14. Ideally, the total relative offset should be just enough to prevent overlap of radiation-band and pass-band, with no more than a small margin between the bands. Excessive shift is likely to result in more conversion of energy to modes other than mode 1, with corresponding increase in loss and ripple. For this reason $Ta_2O_5$ may be a suitable planarisation material when Pt is used for the electrodes. Pt is the heavier of these two materials so the "radiation-band" is still shifted up in frequency for such a combination.

Figure 11:
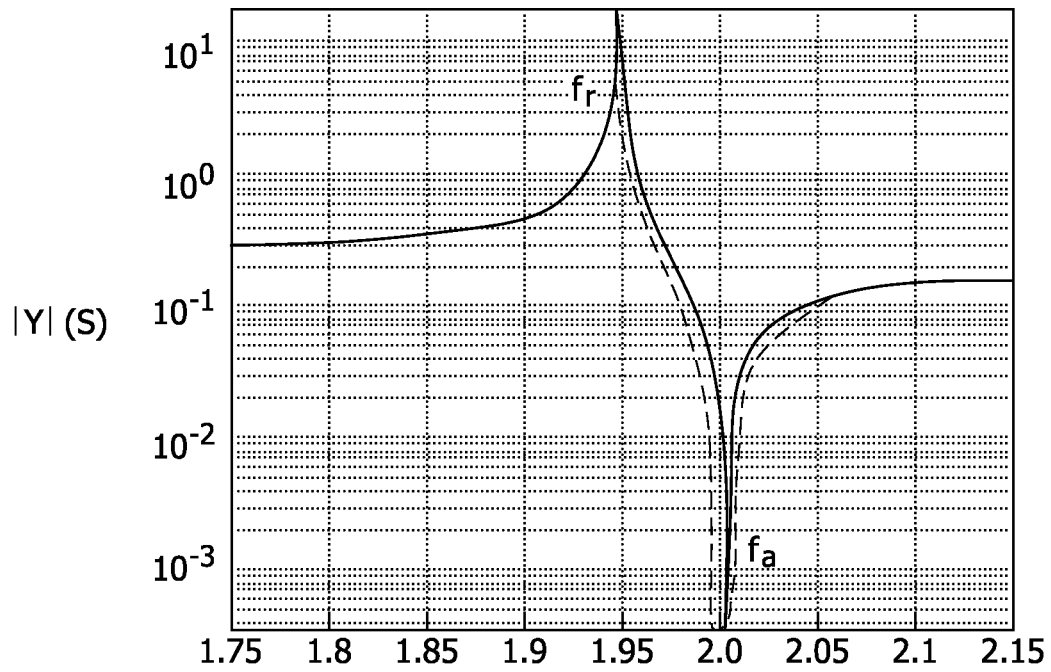
FIG. 11 illustrates the magnitude |Y| of the admittance of a FBAR of width 100 μm, the top layer comprising aluminium having a thickness of 100 nm planarised with a $Ta_2O_5$ dielectric layer also of 100 nm thickness; the broken lines relate to a 1D model and the continuous line relates to a 2D model.
Figure 12:
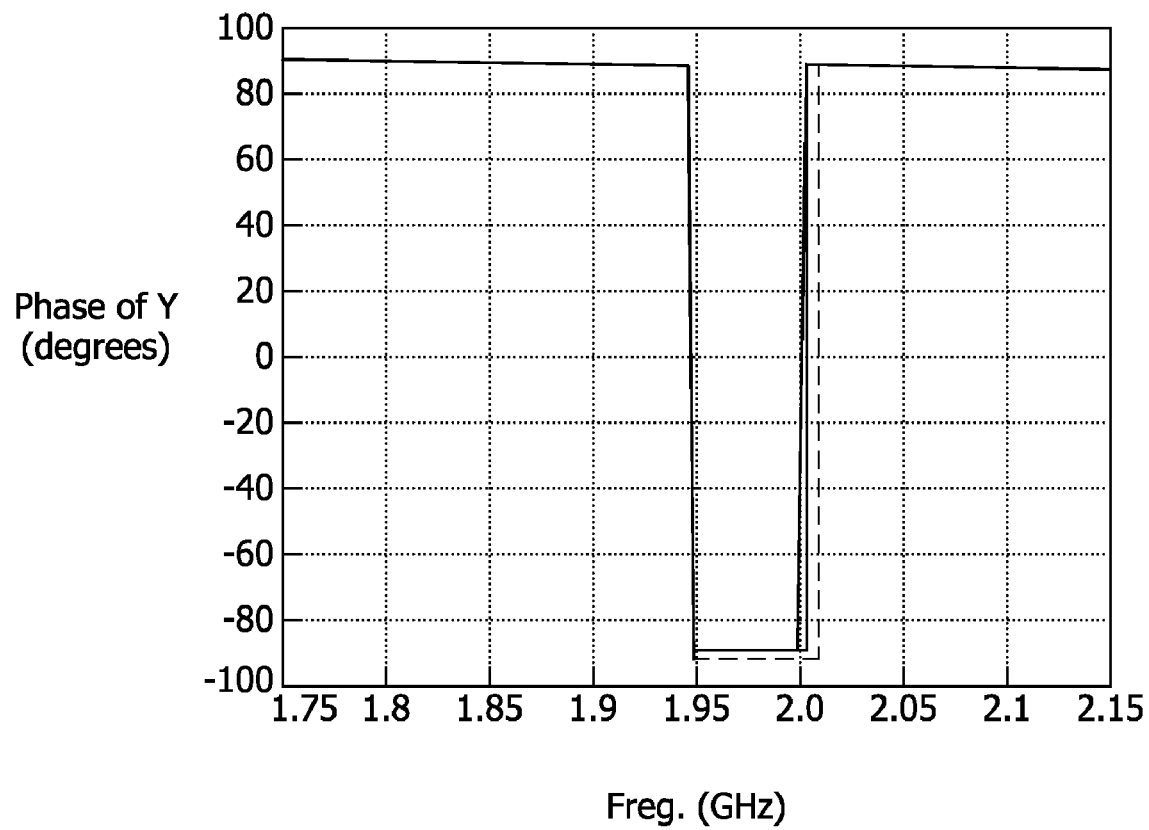
FIG. 12 illustrates the phase of the admittance of a FBAR of width 100 μm, the top layer comprising aluminium having a thickness of 100 nm planarised with a $Ta_2O_5$ dielectric layer also of 100 nm thickness; the broken line relates to a 1D model and the continuous line relates to a 2D model.

FIGS. 11 and 12 demonstrate a result of implementing the proposed scheme. This shows the predicted magnitude (FIG. 11) and phase (FIG. 12) responses of an FBAR having a width of 100 μm and with 100 nm thick Al top electrode 16 and 100 nm thick $Ta_2O_5$ planarisation surrounding dielectric material 18. The broken lines relate to a 1D model and the continuous line to a 2D model. When compared to the phase responses obtained when the radiation-band includes both the resonance frequency $f_r$ and the anti-resonance frequency $f_a$ (such as those shown in FIG. 7) the response has much sharper, squarer phase transitions at these two frequencies. Filters designed using resonators made in accordance with the present invention and employing the described radiation-band offset would therefore exhibit much lower insertion loss. By analogy with FIG. 7, the corresponding SBAR with the same top electrode and planarisation dielectric will also exhibit lower loss, with the further advantage of minimal ripple.

In the interests of brevity fabrication of BAW thin-film devices has been not been described because details are available in many publications, for example H-P. Löbl, et al, "Solidly mounted bulk acoustic wave (BAW) filters for the GHz range", IEEE Ultrasonics Symposium, Munich, p. 897, 2002. For the same reason planarisation has not been disclosed as details can be obtained from PCT Patent Application 2005/034345 and can be realised, for example, by chemical-mechanical polishing (CMP). In choosing materials for the top electrode 16 and the surrounding dielectric (or planarisation) material 18, a 5% to 15% frequency shift translates into approximately 5% to 15% difference in mass between the acoustically active parts of the internal region R1 and the external region R2. By acoustically active parts is meant all the layers above and including the bottom electrode layer. By way of example in a BAW having an internal region R1 comprising Al top electrode 16 and an external region R2 comprising a tantalum pentoxide dielectric material 18, the thickness of both of these regions will need to lie in the range 100 nm to 300 nm.

Typically, achieving lower BAW filter insertion loss using the measures disclosed above will not involve any change to any other layer thicknesses or mask layout, other than typically trivial adjustments to resonator area and piezoelectric layer thickness. These changes will only be required to maintain filter centre frequency and electrical impedance match to 50 ohms at its terminations.

Figure 13:
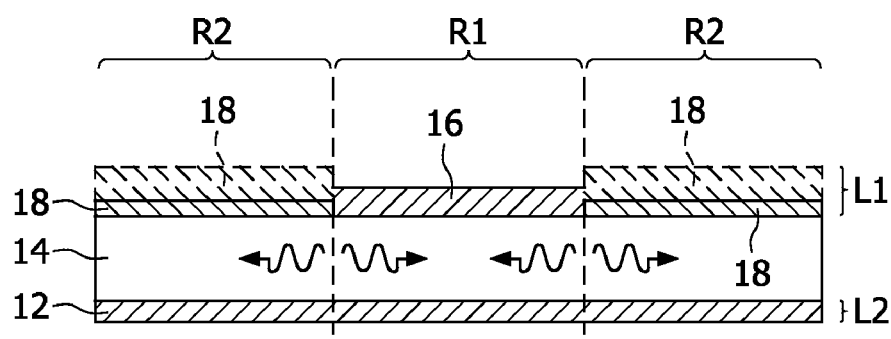
FIG. 13 is a cross-section through the layers of a non-planarised FBAR.

FIG. 13 illustrates an FBAR in which the surrounding dielectric material 18 is not formed as a planarisation material but has thickness which is less than, or greater than, the top electrode 16. This would allow completely free choice of top layer thicknesses in the internal and external regions R1, R2, respectively, with corresponding freedom to implement the optimum off-set between "radiation-band" and filter pass-band. The thicknesses of the top electrode 16 and the dielectric material 18 of the SBAR shown in FIG. 1 can also be different. Non-planar structures however are likely to suffer more loss due to mode-conversion to modes other than mode 1.

Figure 14:
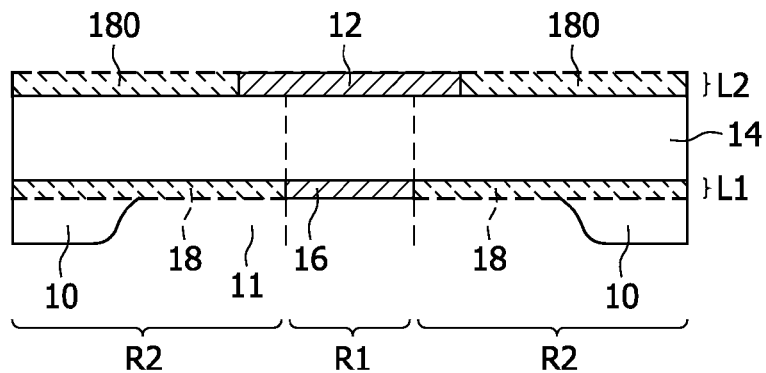
FIG. 14 is a cross-section through the layers of a FBAR in which the position of the layers 12 and 16 have been reversed compared to FIGS. 2 and 13.

FIG. 14 illustrates another embodiment of a FBAR in which the electrode layer closest to the substrate 10, that is the electrode 16, is functionally equivalent to the "top electrode" in the embodiments illustrated in FIGS. 1, 2 and 13. The electrode of the opposite side of the piezoelectric layer 14, that is the electrode 12, is functionally equivalent to the "bottom electrode" 12 in the embodiments illustrated in FIGS. 1, 2 and 13. The internal region R1 (or region type 1) is defined by the area of overlap between the electrodes 16 and 12. The external region R2 (or region type 2) comprises the dielectric material 18 surrounding the electrode 16. Optionally a dielectric material 180 may be provided on the piezoelectric layer 14 and surround the electrode 12. As with the previously described embodiments the internal and external regions R1, R2 are determined by the relative masses of the materials comprising the electrode 16 and the dielectric material 18, the approximate 5% to 15% difference in mass applies also to this embodiment.

The maximum reduction in acoustic loss will follow from the adoption of both optimum "radiation-band" offset and planarisation.

The described measures are applicable to all thin-film BAW filters, particularly to radio-frequency (RF) filters. Very low insertion loss at RF is absolutely crucial in such applications. With lower loss, sensitivity in the receive path is increased, and battery power consumption in the transmit path is reduced. Lower loss is also desirable at intermediate-frequency (IF). A further application is for BAW resonator based oscillators. Here lower loss leads to higher Q-factor and therefore lower phase noise.

Figure 15:
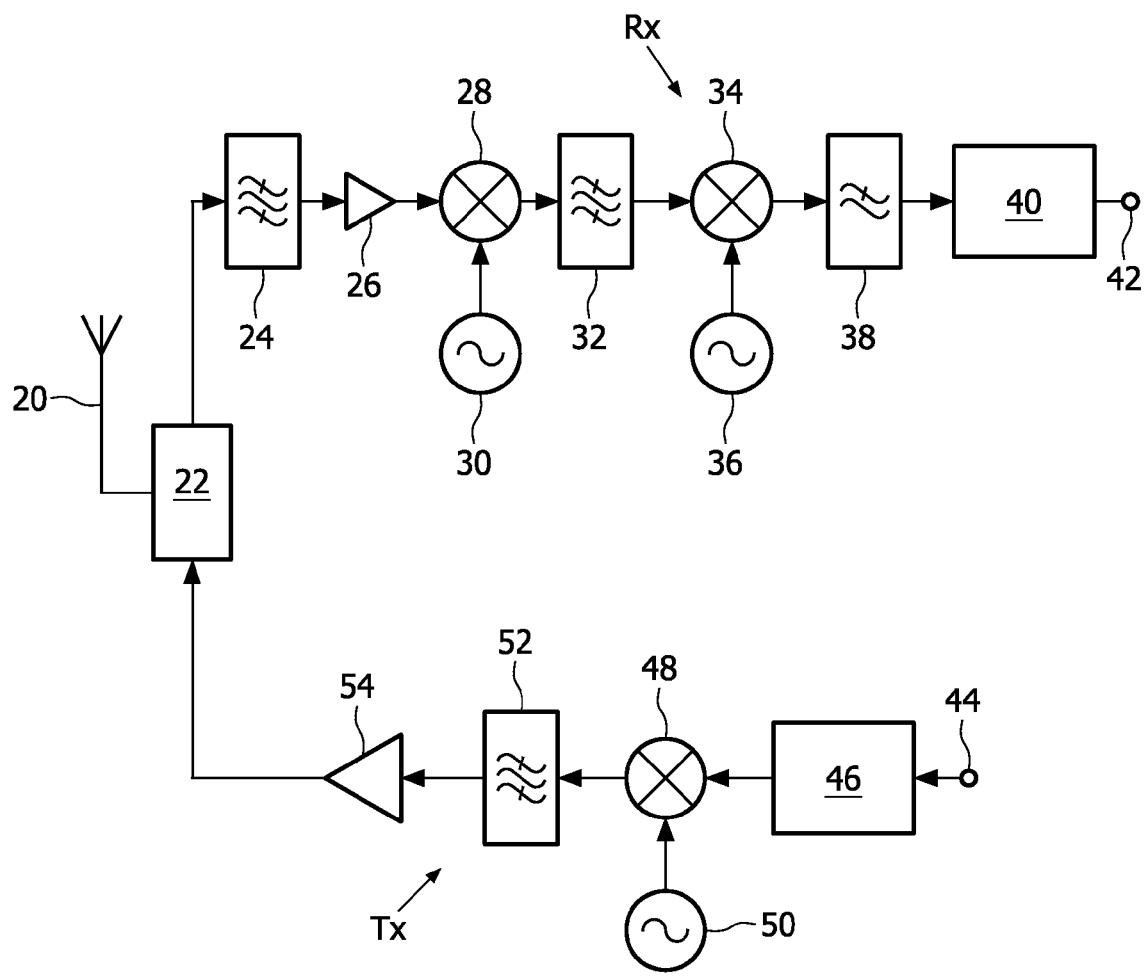
FIG. 15 is a block schematic diagram of a radio transceiver including at least one BAW resonator made in accordance with the present invention.

FIG. 15 illustrates a block schematic diagram of a transceiver employing filters formed by BAW resonators made in accordance with the present invention. The transceiver comprises an antenna 20 which is connected to a duplexer or diplexer 22 which has branches coupled to a superheterodyne receiver section Rx and a transmitter section Tx. The receiver section Rx comprises a RF filter 24 formed by BAW resonators having an input coupled to the diplexer/duplexer 22 and an output coupled to a low noise amplifier (LNA) 26. The RF signal from the LNA 26 is frequency down converted to an Intermediate Frequency (IF) in a mixer 28 to which a local oscillator 30 is connected. An IF output from the mixer 28 is filtered in an IF filter 32 and applied to a second mixer 34 to which a second local oscillator 36 is connected in order to mix the frequency of the IF signal down to a low frequency such as baseband. The signal is low pass filtered in a low pass filter 38 and is subsequently processed in a baseband stage 40 to provide an output on a terminal 42. In an alternative, non-illustrated embodiment of the receiver section Rx, it is implemented as a direct conversion receiver.

The transmitter section Tx comprises an input terminal 44 for information, for example speech or data, to be transmitted which is coupled to a baseband section 46. The output from the baseband section 46 is frequency up-converted in a mixer 48 to which an oscillator 50 is connected. The output signal from the mixer 48 is filtered in a bandpass filter 52 formed by BAW resonators, and applied to a power amplifier 54. An output of the power amplifier 54 is applied to the diplexer/duplexer 22.

In the above description of the invention, wherever the dielectric material 18 has been described as surrounding the electrode 12, the dielectric material may completely or only partially surround the electrode 12.

In the above description of the invention, wherever the dielectric material 18 has been described as surrounding the electrode 12, the dielectric material may touch the electrode 12 or may be spaced by a gap, although the beneficial effect of the invention can be reduced by the presence of a gap. Preferably any gap should be much less than an acoustic wavelength, where the wavelength is typically about 3 microns at 2 GHz, and the gap should be less than 1 micron, where this dimension scales inversely with frequency.

In the present specification and claims the word "a" or "an" preceding an element does not exclude the presence of a plurality of such elements. Further, the word "comprising" does not exclude the presence of other elements or steps than those listed.

The use of any reference signs placed between parentheses in the claims shall not be construed as limiting the scope of the claims.

From reading the present disclosure, other modifications will be apparent to persons skilled in the art. Such modifications may involve other features which are already known in the design, manufacture and use of BAW filters and component parts therefore and which may be used instead of or in addition to features already described herein.

INDUSTRIAL APPLICABILITY

Radio frequency devices and apparatus.

The invention claimed is:

1. A bulk acoustic wave (BAW) resonator comprising first and second layers and an intervening piezoelectric layer, the first and second layers comprising respective first and second overlapping regions of metal for use as electrodes, the first layer further comprising a region of dielectric material external to the region of the overlap and at least partially surrounding the first metal region, wherein the dielectric material has a mass different from the mass of the first metal region;
characterised in that the difference in mass of the dielectric material and the first metal region is between about 5% and about 15% and characterised in that the mass of the dielectric material is less than the mass of the first metal region.

2. A BAW resonator as claimed in claim 1, characterised in that the first metal region comprises platinum and the dielectric material comprises tantalum pentoxide.

3. A BAW resonator as claimed in claim 1, characterised in that the first metal region comprises molybdenum and the dielectric material comprises silicon dioxide.

4. A BAW resonator as claimed in claim 1, characterised in that the dielectric material has the same thickness as the first metal region.

5. A BAW resonator as claimed in claim 1, characterised in that the second layer comprises a region of dielectric material external to the region of overlap and at least partially surrounding the second metal region.

6. A BAW resonator as claimed in claim 1, wherein the region of dielectric material is spaced from the first metal region.

7. A BAW resonator as claimed in claim 1, characterised in that the resonator comprises a Solidly-mounted-Bulk-Acoustic wave-Resonator.

8. A BAW resonator as claimed in claim 1, characterised in that the resonator comprises a Film-Bulk-Acoustic-wave-Resonator.

9. A filter comprising a plurality of BAW resonators as claimed in claim 1.

10. A radio frequency apparatus including a filter comprising a plurality of BAW resonators as claimed in claim 1.

11. A BAW resonator as claimed in claim 1, wherein the difference in mass is selected in order to avoid overlap between a passband of the first metal region and a radiation band of the region of the dielectric material.

12. A method of reducing insertion loss in the passband of a filter comprising a plurality of bulk acoustic wave (BAW) resonators, each of the BAW resonators comprising first and second layers and an intervening piezoelectric layer, the first and second layers comprising respective first and second overlapping regions of metal for use as electrodes, the method comprising forming in the first layer a region of dielectric material external to the region of the overlap and at least partially surrounding the first metal region, wherein the dielectric material has a mass different from the mass of the first metal region;
characterised in that the difference in mass of the dielectric material and the first metal region is between about 5% and about 15% and characterised in that the mass of the dielectric material is less than the mass of the first metal region.

13. A method as claimed in claim 12, characterised by forming the dielectric material to have the same thickness as the first metal region.

14. A method as claimed in claim 12, wherein the difference in mass is selected in order to avoid overlap between a passband of the first metal region and a radiation band of the region of the dielectric material.

* * * * *